United States Patent [19] [11] 4,359,369
Takamizawa et al. [45] Nov. 16, 1982

[54] PHOTOCURABLE ORGANOPOLYSILOXANE COMPOSITIONS

[75] Inventors: Minoru Takamizawa, Annaka; Fumio Okada, Takasaki; Yasuaki Hara, Annaka; Hisashi Aoki, Annaka; Yoshio Inoue, Annaka, all of Japan

[73] Assignee: Shin-Etsu Chemical Co., Ltd., Tokyo, Japan

[21] Appl. No.: 180,934

[22] Filed: Aug. 25, 1980

[30] Foreign Application Priority Data

Aug. 29, 1979 [JP] Japan ................................ 54-110136
Nov. 13, 1979 [JP] Japan ................................ 54-146727
Dec. 13, 1979 [JP] Japan ................................ 54-162328

[51] Int. Cl.$^3$ ........................ G03C 1/68; C08G 77/00
[52] U.S. Cl. ............................ 204/159.13; 430/286; 430/287; 430/288; 526/279; 528/30
[58] Field of Search ............... 430/286, 287, 288, 281, 430/270; 204/159.13; 526/279; 528/30

[56] References Cited

U.S. PATENT DOCUMENTS 3,782,940 1/1974 Otto et al. ........................... 430/287
4,070,526 1/1978 Cocquttoun et al. ............... 430/281
4,201,808 5/1980 Cully et al. ......................... 430/281
4,262,073 4/1981 Pampalone et al. ................ 430/281
4,301,231 11/1981 Atarashi et al. .................... 430/287

Primary Examiner—Jack P. Brammer
Attorney, Agent, or Firm—Toren, McGeady & Stanger

[57] ABSTRACT

The invention provides a novel photocurable organopolysiloxane composition having an unusually high photosensitivity suitable, for example, for providing an anti-sticking layer on a release paper. The composition comprises an organopolysiloxane having, in a molecule, at least one thioacyloxy-containing organosiloxane unit as the photosensitive functional group and a photosensitizer. Further improved photocurable composition of the invention comprises an organopolysiloxane having, in addition to the above mentioned thioacyloxy-containing organosiloxane units, at least one mercaptohydrocarbyl-containing organosiloxane unit in a molecule. Alternatively, photosensitivity of the similar degree is obtained when the composition comprises a first organopolysiloxane having, in a molecule, at least one thioacyloxy-containing organosiloxane unit and a second organopolysiloxane having, in a molecule, at least one mercaptohydrocarbyl-containing organosiloxane unit as combined.

11 Claims, No Drawings

PHOTOCURABLE ORGANOPOLYSILOXANE COMPOSITIONS

BACKGROUND OF THE INVENTION

The present invention relates to a novel photocurable organopolysiloxane composition or, more particularly, to a photocurable organopolysiloxane composition having unusually high photosensitivity when irradiated with light rich in ultraviolet to be converted into insoluble and infusible cured products with excellent properties such as a coating film on a substrate.

Needless to say, various types of organopolysiloxane compositions are used in a variety of application fields owing to their unique properties as a polymeric material. It is a common practice that these compositions are used as cured in a cured state such as paints and varnishes for coating various substrates or an anti-sticking layer in release papers.

Such a cured coating layer is obtained, of course, by first providing a layer of an uncured organopolysiloxane composition on the surface of the substrate and then curing the organopolysiloxane composition with formation of crosslinks between the molecules of the organopolysiloxane. The crosslink formation between the organopolysiloxane molecules takes place in several different ways and the most conventional way for obtaining crosslinking of organopolysiloxane molecules is the condensation reaction or addition reaction between functional groups of the molecules accelerated by heat.

The method of heat curing is simple in principle and widely used but it is not applicable when a high curing velocity is desired. In addition, the application of heat curing is largely limited when the substrate material has an insufficient heat resistance.

Alternatively, photochemical means for curing organopolysiloxane compositions have been proposed in which crosslinks are formed between the photosensitive functional groups of the organopolysiloxane when the composition is irradiated with light, especially, rich in ultraviolet. Various kinds of photosensitive groups as well as photosensitizers have been proposed. As an example, a photocurable organopolysiloxane composition is disclosed in Japanese Patent Disclosure 5061386 comprising a first organopolysiloxane containing mercapto groups, a second organopolysiloxane containing vinyl groups and a photosensitizer. Mercapto-containing photocurable compositions of this type are disadvantageous because of the unpleasant odor as well as the relatively poor durability of the releasability when they are used for providing an antisticking layer on release papers.

Another example of the photocurable organopolysiloxane composition disclosed in Japanese Patent Publication 53-2911 comprises an organopolysiloxane having acryloxy groups or methacryloxy groups as the photosensitive functional groups, a photosensitizer and, optionally, an organic solvent. One of the problems in the photocurable compositions of this type is that the surface of the photocured film of the composition is more or less tacky even after prolonged irradiation with light when photocuring is effected in air due to the influence of the atmospheric oxygen so that the irradiation should be performed in an atmosphere of nitrogen or other inert gases when complete removal of surface tackiness is desired.

In addition to the above described problems in the prior art photocurable organopolysiloxane compositions, further and further increased photosensitivity is eagerly desired as a matter of course for improving productivity.

SUMMARY OF THE INVENTION

It is therefore an object of the present invention to provide a novel and improved photocurable organopolysiloxane composition free from the above described problems in the prior art photocurable organopolysiloxane compositions and yet having unusually high photosensitivity to be cured by an extremely short time of irradiation.

Further object of the present invention is to provide a novel organopolysiloxane hitherto not described in any prior art literatures suitable for use as a main component of the above mentioned photocurable organopolysiloxane composition.

Thus, the photocurable organopolysiloxane composition of the present invention comprises (a) an organopolysiloxane having, in a molecule, at least one organosiloxane unit represented by the general formula

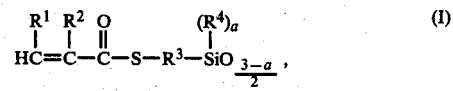

where $R^1$ is a hydrogen atom, a phenyl group or a halogen-substituted phenyl group, $R^2$ is a hydrogen atom or an alkyl group having from 1 to 4 carbon atoms, $R^3$ is a divalent hydrocarbon group or a divalent halogen-substituted hydrocarbon group, $R^4$ is a monovalent hydrocarbon group or a monovalent halogen-substituted hydrocarbon group and a is zero, 1 or 2, and (b) an effective amount of a photosensitizer.

The organosiloxane units contained in the organopolysiloxane other than the above described organosiloxane unit represented by the formula (I) are not limitative but further increased photosensitivity is obtained when the organopolysiloxane contains at least one organosiloxane unit represented by the general formula

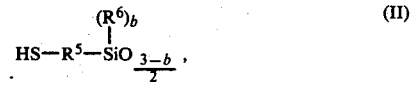

where $R^5$ is a divalent hydrocarbon group, $R^6$ is a monovalent hydrocarbon group and b is zero, 1 or 2.

Alternatively, improvements in the photosensitivity can be obtained when the organopolysiloxane composition further comprises a second organopolysiloxane having, in a molecule, at least one organosiloxane unit represented by the above general formula (II) instead of using an organopolysiloxane containing both types of the organosiloxane units of the general formulas (I) and (II) in the same molecule.

The most preferable type of the organopolysiloxane containing the organosiloxane unit of the formula (I) is a linear diorganopolysiloxane containing at least one difunctional organosiloxane unit represented by the general formula

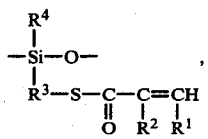

Where $R^1$, $R^2$, $R^3$ and $R^4$ each have the same meaning as defined above. The diorganopolysiloxanes of this type are novel compounds hitherto not known or not described in any prior art literatures.

DETAILED DESCRIPTION OF THE PREFERRED EMBODIMENTS

The essential main component in the inventive photocurable organopolysiloxane composition is an organopolysiloxane containing at least one organosiloxane unit represented by the general formula (I) above. In other words, the organopolysiloxane has at least one unsaturated thioacyloxy group represented by the general formula

where $R^1$ and $R^2$ each have the same meaning as defined above, bonded to the silicon atom in the molecule through a divalent hydrocarbon group represented by the symbol $R^3$ in the formula (I).

A diversity of groups are included in the class of the unsaturated thioacyloxy group of the formula (IV) according to the kinds of the groups $R^1$ and $R^2$. Particularly suitable groups are thioacryloxy group in which $R^1$ and $R^2$ are each a hydrogen atom, thiomethacryloxy group in which $R^1$ is a hydrogen atom and $R^2$ is a methyl group, thiocinnamoyloxy group in which $R^1$ is a phenyl group and $R^2$ is a hydrogen atom, thiohalogenocinnamoyloxy group in which $R^1$ is a halogen-substituted phenyl group and $R^2$ is a hydrogen atom, and the like.

The group represented by the symbol $R^3$ through which the above thioacyloxy group is bonded to the silicon atom in the organopolysiloxane molecule is a halogen-substituted or unsubstituted divalent hydrocarbon group exemplified by alkylene groups such as methylene, ethylene, propylene, butylene and the like, arylene groups such as phenylene, tolylene and the like, and alkarylene groups such as phenethylene and the like as well as those substituted groups with halogen atoms in place of part or all of the hydrogen atoms in the above named divalent hydrocarbon groups. It is preferable that the group $R^3$ is a trimethylene or propylene group $+CH_2\}_3$ by the reason of easiness in synthetic preparation.

The group $R^4$ directly bonded to the silicon atom in the organosiloxane unit of the formula (I) is a halogen-substituted or unsubstituted monovalent hydrocarbon group exemplified by groups such as methyl, ethyl, propyl and the like, arly groups such as phenyl and the like, alkenyl groups such as vinyl, allyl and the like, cycloalkenyl groups such as cyclohexenyl and the like, alkaryl groups such as tolyl and the like and aralkyl groups such as benzyl and the like as well as those substituted groups with halogen atoms in place of part or all of the hydrogen atoms in the above named divalent hydrocarbon groups.

The number a is zero, 1 or 2 which defines the functionality of the organosiloxane unit of the formula (I), i.e. the unit is tri-, di- or monofunctional when a is zero, 1 or 2, respectively.

The organopolysiloxane must contain at least one thioacyloxy-containing organosiloxane unit of the formula (I) and may be composed of the thioacyloxy-containing organosiloxane units only. It is, however, usually composed of the thioacyloxy-containing organosiloxane units of the formula (I) and organosiloxane units of the other types having no thioacyloxy groups. It is recommended that at least 0.1% by moles or, preferably, at least 1.0% by moles of the organosiloxane units in the organopolysiloxane be the thioacyloxy-containing units of the formula (I) in order to obtain sufficiently high photosensitivity of the composition. Higher photosensitivity is obtained by increasing the molar content of the thioacyloxy-containing units of the formula (I) though with sacrifice of other desirable properties such as mechanical strengths. The configuration of the organopolysiloxane molecule is also not limitative including linear chain, branched chain or ring-wise.

The siloxane units to be combined with thioacyloxy-containing organosiloxane unit of the formula (I) may be mono-, di-, tri- or tetrafunctional as expressed by the formulas of $R_3SiO_{0.5}$, $R_2SiO$, $RSiO_{1.5}$ or $SiO_2$, respectively, where R is a halogen-substituted or unsubstituted monovalent hydrocarbon group exemplified by the groups similar to those for the group $R^4$. Particular examples of the siloxane units include dimethylsiloxane unit $Me_2SiO$, methylphenylsiloxane unit MePhSiO, diphenylsiloxane unit $Ph_2SiO$, methylsiloxane unit $MeSiO_{1.5}$, phenylsiloxane unit $PhSiO_{1.5}$, trimethylsiloxy unit $Me_3SiO_{0.5}$ and the like, where Me and Ph denote a methyl groups and a phenyl group, respectively.

When good mechanical properties of the cured products of the inventive composition are taken into consideration, it is preferable that the organopolysiloxane is a diorganopolysiloxane of a linear molecular configuration as represented by the following formula

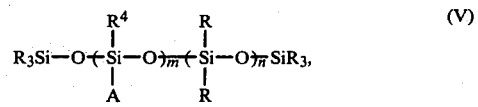

where R and $R^4$ each have the same meaning as defined above, A is an abridgment for the group containing a thioacyloxy group of the formula (IV) and m and n are each a positive integer.

Further, when the surface releasability of the cured film of the inventive composition is the most essential property as in the antisticking layer of release papers, it is recommended that substantially all or at least 95% in number of the organic groups other than the thioacyloxy-containing groups are methyl groups, for example, as expressed by the formula

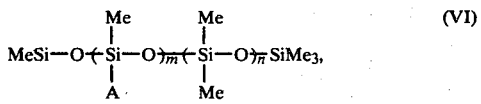

where Me, A, m and n each have the same meaning as defined above.

It is of course that the thioacyloxy-containing group denoted by A in the above formulas may be bonded to the terminal silicon atoms of the molecular chain of the organopolysiloxane. Several of the examples of the organopolysiloxanes suitable as the component (a) are as given below, in which $A^1$ is a 3-thioacryloxypropyl group of the formula

$A^2$ is a 3-thiocinnamoyloxypropyl group of the formula

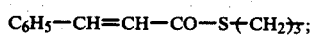

and $A^3$ is a 3-thiomethacryloxypropyl group of the formula

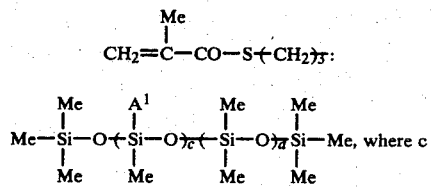

where c is a positive integer and d is zero or a positive integer;

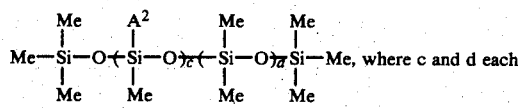

where c and d each have the same meaning as defined above;

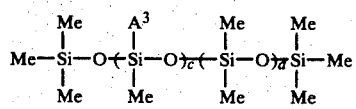

where c and d each have the same meaning as defined above;

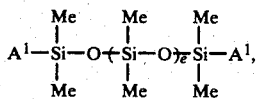

where e is zero or a positive integer; and

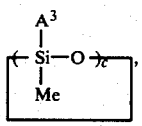

where c has the same meaning as defined above.

The degree of polymerization or viscosity of the thioacyloxy-containing organopolysiloxane may be widely different according to particular applications and those with an extremely large molecular weight having a gum-like consistency can also be used. Although the particular viscosity should be determined in consideration of the workability of the finally obtained composition with formulation of the photosensitizer and other optional additive ingredients, the organopolysiloxane has preferably a viscosity of about 50 to about 10,000 centistokes at 25° C. when the photocurable composition is used for the preparation of release papers without dilution with an organic solvent although still higher viscosity is not excluded when dilution with an organic solvent is allowable.

The thioacyloxy-containing organopolysiloxanes used in the inventive photocurable composition are prepared by several different ways, for example, described below. Firstly, a thioacyloxy-containing organochlorosilane or alkoxysilane as disclosed in Japanese Patent Disclosure No. 51-110523 or a mixture of such a silane and one or more kinds of other hydrolyzable silanes is subjected to hydrolysis and condensation reaction in a conventional manner followed, if necessary, by equilibration reaction into the desired organopolysiloxane. Secondly, an acid chloride expressed by the formula

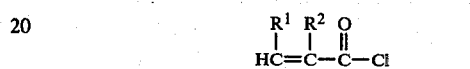

where $R^1$ and $R^2$ each have the same meaning as defined above, is reacted with a mercapto-containing organopolysiloxane in the presence of an acid acceptor by dehydrochlorination reaction. Thirdly, an addition reaction is undertaken between an organohydrogenpolysiloxane having at least one hydrogen atom directly bonded to the silicon atom and a thioacyloxy compound of the formula

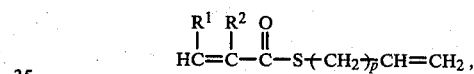

where $R^1$ and $R^2$ each have the same meaning as defined above and p is a positive integer, in the presence of a platinum catalyst.

Various kinds of compounds known in the art as a photosensitizer in a photocurable resin composition are also suitable as the component (b) in the inventive photocurable organopolysiloxane composition. Several of the examples are acetophenone, propiophenone, benzophenone, xanthone, fluorenone, benzaldehyde, fluorene, anthraquinone, triphenylamine, carbazole, 3-methylacetophenone, 4-chlorobenzophenone, 4,4'-dimethoxybenzophenone and N,N,N',N'-tetramethyl-4,4'-diaminobenzophenone (Michler's ketone) as well as silicon-containing benzophenone derivatives as disclosed in Japanese Patent Publication No. 51-48794 and silicon-containing benzoin derivatives as disclosed in Japanese Patent Disclosure No. 54-44643 having good compatibility with the thioacyloxy-containing organopolysiloxanes.

The above mentioned silicon-containing benzoin derivatives and silicon-containing benzophenone derivatives are particularly preferable when a completely solvent-free photocurable organopolysiloxane composition is desired since they can be used without dilution with a solvent used in the case of solid photosensitizers. They have excellent compatibility with organopolysiloxanes and free from the problems of decreasing in the photosensitivity and unevenness in photocuring due to segregation or precipitation as well as poor storability of the composition.

The amount of the photosensitizer to be added in the composition is naturally determined depending on several factors such as the kind of the photosensitizer and desired velocity of photocuring. As a rough measure of the amount, the photosensitizer is added in the photocurable composition in an amount in the range from about 0.05 to 10% by weight based on the organopolysiloxane as the component (a).

The composition of the present invention may be admixed with various kinds of additive ingredients conventionally used in similar compositions. For example, an anti-oxidant such as hydroquinone serves for extending the pot life of the composition when added in an amount of 50 to 1000 p.p.m. Further, it is optional to add a conventional diorganopolysiloxane, a filler, a coloring agent and the like to the inventive composition according to need.

The photocurable organopolysiloxane composition of the present invention is rapidly cured when irradiated with light rich in ultraviolet. Suitable lamps as the light source are exemplified by xenon lamps, low-pressure, medium-pressure and high-pressure mercury lamps and the like emitting light rich in ultraviolet. The irradiation time required for complete curing of the composition naturally depends on various parameters but complete cure can be obtained even with irradiation for 0.5 second or less by use of a conventional lamp when the composition is in a form of a relatively thin layer such as on a paper substrate for release papers. For example, a coating layer of a thickness of about 1 μm of an inventive composition can be cured completely when irradiated in an atmosphere of nitrogen with light from two fluorescent lamps of each 80 watts/cm power placed 8 cm apart from the coating layer for about 0.3 second.

With the above described unusually high photosensitivity, the photocurable organopolysiloxane composition of the present invention is useful in a variety of technological fields such as an anti-sticking agent for release papers, potting material for electronic devices, coating material for various plastic materials as well as for glass-woven sleeves, impregnating agent for electric insulation, water-repellent agent, paint and the like. As is mentioned before, the composition of the invention can be used either as a solventless composition or as diluted with an organic solvent when a decreased viscosity is desired. Further, the composition can give cured products with rigidity or elasticity according to need by suitably selecting the organopolysiloxane for a varnish composition or a rubber composition, respectively.

Despite the above described unusually high photosensitivity, a still higher photosensitivity has been sometimes desired for further improved productivity. The inventors have conducted continued investigations for obtaining such a photocurable organopolysiloxane composition having a still higher photosensitivity and arrived at an unexpected discovery as described below.

In contrast to the above described organopolysiloxane as the component (a), in which the organosiloxane units other than the unsaturated thioacyloxy group-containing units can be freely selected from any kinds of organosiloxane units, mostly methylsiloxane units, an improvement in the photosensitivity is obtained when the organopolysiloxane contains at least one mercaptohydrocarbyl-containing organosiloxane unit represented by the general formula (II) previously given.

In the general formula (II), $R^5$ is a divalent hydrocarbon group exemplified by those groups similar to the groups named as the examples of $R^3$. Further, $R^6$ in the formula is a monovalent hydrocarbon group exemplified by those groups similar to the groups named as the examples of $R^4$ in the formula (I). Similarly to the group $R^3$, the group $R^5$ is preferably a trimethylene or propylene group $+CH_2+_3$ by the reason of easiness in the synthetic preparation. The number b in the formula (II) is zero, 1 or 2 so that the mercaptohydrocarbyl group is bonded to the silicon atom in a tri-, di- and monofunctional siloxane unit, respectively.

The organopolysiloxane in this further improved photocurable composition contains necessarily at least one thioacyloxy-containing organosiloxane unit of the formula (I) and at least one mercaptohydrocarbyl-containing organosiloxane unit of the formula (II) in a molecule. The molecular configuration of the organopolysiloxane is not limitative including linear chain, branched chain and cyclic ones and the position of the silicon atoms to which the thioacyloxy groups and the mercaptohydrocarbyl groups are bonded may be at the chain terminals or in the middle of the molecular chains without particular limitation.

The types of the organosiloxane units other than the thioacyloxy-containing and mercaptohydrocarbyl-containing organosiloxane units are not limitative but, from the standpoint of obtaining good releasability as is essential in the application of the composition to release papers, the organic groups other than the thioacyloxy-containing and mercaptohydrocarbyl groups are preferably methyl groups.

The organopolysiloxane containing both the thioacyloxy groups and the mercaptohydrocarbyl groups can be prepared by co-hydrolyzing a mixture of the corresponding hydrolyzable organosilanes followed by the partial or complete condensation reaction and, if necessary, the equilibration reaction in a manner well known in the art of silicones.

Several of the examples of the thioacyloxy- and mercaptohydrocarbyl-containing organopolysiloxanes are as given below, in which $A^1$ is an abridgement for a 3-thioacryloxypropyl group

$B^1$ is an abridgement for a 3-mercaptopropyl group

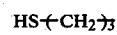

and Me is a methyl group:

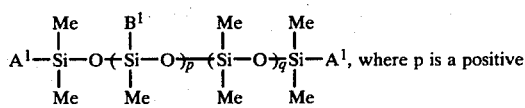

where p is a positive integer and q is zero or a positive integer;

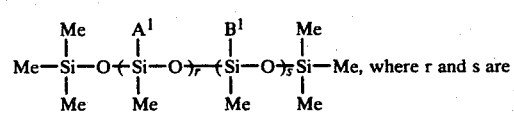

where r and s are each a positive integer;

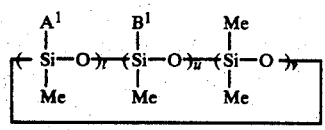

where t and u are each a positive integer and v is zero or a positive integer with the proviso that $t+u+v \geq 3$; and $(A^1SiO_{1.5})_w(B^1SiO_{1.5})_x(Me_2SiO)_y$, where w, x and y are each the mole fraction of the respective siloxane units with the proviso that $w+x+y=1$ where w and x are each not equal to zero.

The photosensitizer as the component (b) and the other optional additives in the photocurable compositions with the thioacyloxy- and mercaptohydrocarbyl-containing organopolysiloxane may be the same ones as in the case of the organopolysiloxane having no mercaptohydrocarbyl groups and need not be repeated here.

As is mentioned before, the inclusion of the mercaptohydrocarbyl groups in the organopolysiloxane is effective in decreasing the dose of irradiation with light to obtain sufficient curing. For example, a photocurable organopolysiloxane composition with an organopolysiloxane containing both the thioacyloxy and mercaptohydrocarbyl groups can be cured by the irradiation for about 0.2 second or less under the conditions sufficient to cure a similar composition with an organopolysiloxane containing the thioacyloxy groups but no mercaptohydrocarbyl groups by the irradiation for about 0.5 second or longer.

As a result of further continued investigation for improving the photosensitivity of the inventive photocurable composition, the inventors have arrived at a conclusion that the improvement obtained by the incorporation of the mercaptohydrocarbyl-containing organosiloxane units in the organopolysiloxane is achieved to about the same degree even when the thioacyloxy-containing organosiloxane units and the mercaptohydrocarbyl-containing organosiloxane units are not contained in one and the same organopolysiloxane but a first organopolysiloxane containing thioacyloxy-containing organosiloxane units and a second organopolysiloxane containing mercaptohydrocarbyl-containing organosiloxane units are used as blended together.

Thus, the improved photocurable organopolysiloxane composition comprises (a-1) an organopolysiloxane having at least one organosiloxane unit represented by the above given general formula (I) in a molecule, (a-2) an organopolysiloxane having at least one organosiloxane unit represented by the above given general formula (II) in a molecule and (b) an effective amount of a photosensitizer.

Details of the thioacyloxy-containing organopolysiloxane as the component (a-1) have been described and are not repeated here. The mercaptohydrocarbyl group in the component (a-2) is preferably a mercaptoalkyl group such as mercaptomethyl, mercaptoethyl, mercaptopropyl and mercaptobutyl groups, among which 3-mercaptopropyl group $+CH_2\mathrm{)}_3SH$ is the most preferred by the reason of easiness in synthetic preparation. The mercaptohydrocarbyl-containing organosiloxane unit may be tri-, di- or monofunctional according to the value of b in the formula (II). The organopolysiloxane as the component (a-2) contains necessarily at least one mercaptohydrocarbyl-containing organosiloxane unit of the formula (II) and may be composed of such mercaptohydrocarbyl-containing organosiloxane units alone without containing other types of organosiloxane units. These organosiloxane units having no mercaptohydrocarbyl group are not particularly limitative including those exemplified in the thioacyloxy-containing organopolysiloxane. It is preferable that at least 95% by moles of the organic groups other than the mercaptohydrocarbyl groups are methyl groups when the organopolysiloxane composition is used for antisticking use such as in release papers.

The method for the preparation of the mercaptohydrocarbyl-containing organopolysiloxane is well known in the art and need not be described here in detail. Several of the examples of the mercaptohydrocarbyl-containing organopolysiloxanes are as follows, in which $B^1$ is a mercaptopropyl group

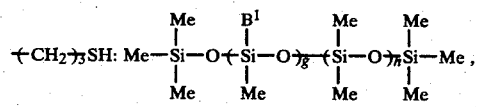

in which g is a positive integer and h is zero or a positive integer;

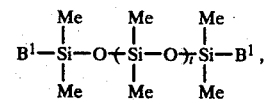

in which i is zero or a positive integer; and

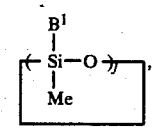

in which j is an integer of 3 or larger.

In formulating the photocurable organopolysiloxane composition comprising the components (a-1) and (a-2), it is recommended that the ratio of the amounts of these two types of organopolysiloxanes is such that the molar ratio of the thioacyloxy groups to the mercaptohydrocarbyl groups is in the range from 1:100 to 100:1 or, preferably, from 1:10 to 10:1. The amount of the photosensitizer as the component (b) is preferably in the range from 0.05 to 10% by weight based on the total amount of the components (a-1) and (a-2).

In the following, the present invention is described in further detail by way of examples.

EXAMPLE 1

A mixture composed of 52.8 g (0.2 mole) of 3-thiomethacryloxypropyl trimethoxysilane, 72.0 g (0.6 mole) of dimethyldimethoxysilane and 39.6 g (0.2 mole) of phenyltrimethoxysilane in 300 ml of toluene was gradually added drop-wise into 300 ml of 10% hydrochloric acid kept at 50° to 60° C. under agitation to effect co-hydrolysis of the silanes. After completion of the hydrolysis, the mixture was washed with water to neutral and dehydrated followed by removal of part of the solvent under reduced pressure to give a silicone varnish of a solid content of 60% containing 3-thiomethacryloxypropyl-containing organopolysiloxane.

The thus obtained silicone varnish was admixed with Michler's ketone in an amount of 1% by weight based on the solid content of the varnish. The varnish was applied to the surface of a steel plate in a coating thickness of about 25 μm as dried and, after drying at room temperature, the coating layer was irradiated for 5 seconds with a 2-kilowatts high-pressure mercury lamp placed 16 cm apart to be converted to a cured film with no surface tackiness adhering firmly to the steel plate.

EXAMPLE 2

A silicone varnish of a 3-thiomethacryloxypropyl-containing organopolysiloxane was prepared in a similar manner to that in the preceding example in which the silane mixture subjected to co-hydrolysis was composed of 20% by moles of 3-thiomethacryloxypropyl trimethoxysilane, 40% by moles of dimethyldimethoxysilane, 30% by moles of phenyltrimethoxysilane and 10% by moles of diphenyldimethoxysilane.

The silicone varnish thus obtained was admixed with a trimethylsilylated benzophenone derivative in an amount of 2% by weight based on the solid content of the varnish. The varnish was applied to the surface of a copper plate or an aluminum plate in a coating thickness of about 25 μm as dried and, after drying at room temperature, the coating layer was irradiated for 10 seconds with a 2-kilowatts high-pressure mercury lamp placed 16 cm apart to be converted to a cured film with no surface tackiness adhering firmly to the copper or aluminum substrate.

EXAMPLE 3

Into a reaction vessel were introduced 151.7 g (0.01 mole) of a mercaptopropyl-containing diorganopolysiloxane having a viscosity of 560 centistokes at 25° C. and composed of 97% by moles of dimethylsiloxane units and 3% by moles of 3-mercaptopropylmethylsiloxane units as terminated at both chain ends with trimethylsilyl groups, 7.3 g (0.072 mole) of triethylamine, 0.1 g of hydroquinone and 300 ml of toluene and 7.5 g (0.072 mole) of methacrylic acid chloride was added drop-wise into the reaction mixture kept at a temperature of 5° to 10° C. with agitation to effect the dehydrochlorination condensation.

After completion of the reaction, the reaction mixture was washed with water, dehydrated, filtered and subjected to stripping to remove the solvent and low molecular weight organopolysiloxanes to give 124 g of a 3-thiomethacryloxypropyl-containing organopolysiloxane having a viscosity of 738 centistokes at 25° C. The yield was about 93% of the calculated value.

The thus obtained organopolysiloxane product was admixed with 1% by weight of benzophenone, applied to the surface of an aluminum plate in a coating thickness of about 25 μm and irradiated for 5 seconds with a 2-kilowatts high-pressure mercury lamp placed 8 cm apart to be converted to a cured film with no surface tackiness having rubbery elasticity and adhering firmly to the aluminum substrate.

EXAMPLE 4

Into a reaction vessel were introduced 150 g (0.02 mole) of an organopolysiloxane having a viscosity of 80 centistokes at 25° C. and composed of 94% by moles of dimethylsiloxane units and 6% by moles of methylhydrogensiloxane units as terminated at both chain ends with trimethylsilyl groups, 0.01 g of hydroquinone, 0.01 g of a chloroplatinic acid catalyst in isopropyl alcohol and 300 ml of toluene and 18.4 g (0.144 mole) of allyl thioacrylate was added drop-wise to the reaction mixture to effect the addition reaction while the reaction mixture was heated at 90° to 100° C. with agitation.

After completion of the reaction, the reaction mixture was washed with a 1% aqueous solution of sodium carbonate, washed with water, dehydrated and subjected to stripping of the solvent and low molecular weight organopolysiloxanes to give 149 g of a 3-thioacryloxypropyl-containing organopolysiloxanes having a viscosity of 124 centistokes at 25° C. The yield was about 88% of the calculated value.

The thus obtained organopolysiloxane was admixed with 2% by weight of benzoin methyl ether as a photosensitizer, applied to a substrate surface and irradiated for 3 seconds with a 2-kilowatts high-pressure mercury lamp placed 8 cm apart to be converted to a cured film with no surface tackiness.

EXAMPLE 5

Six kinds of thioacyloxy-containing diorganopolysiloxanes S-I to S-VI according to the invention and three kinds of acyloxy-containing diorganopolysiloxanes S-VII to S-IX for comparative purpose were prepared according to the procedure described in Example 3 or Example 4. The molecular structures of these organopolysiloxanes are as follows, in which $A^1$ is a 3-thioacryloxypropyl group $CH_2=CH-CO-S-(CH_2)_3$, $A^3$ is a 3-thiomethacryloxypropyl group $CH_2=CMe-CO-S-(CH_2)_3$ and $A^{3'}$ is a 3-methacryloxypropyl group $CH_2=CMe-CO-O-(CH_2)_3$.

S-I:
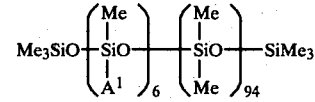

S-II:
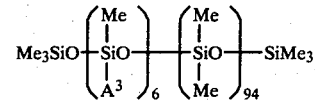

S-III:
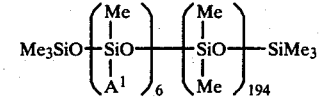

S-IV:
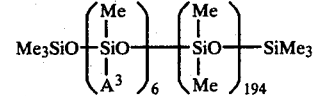

S-V:
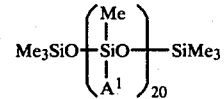

S-VI:
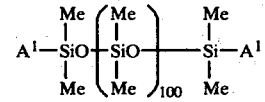

S-VII: 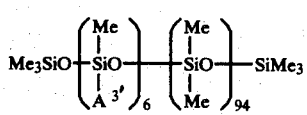

S-VIII: 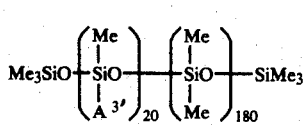

S-IX: 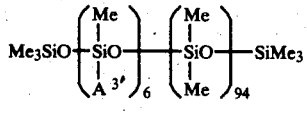

Each 100 parts by weight of the above prepared organopolysiloxanes were admixed with 10 parts by weight of a benzoin-terminated dimethylpolysiloxane of the formula

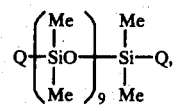

where Q is a benzoin group of the formula

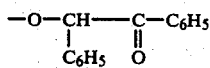

as a photosensitizer and a polyethylene-laminated paper was coated with the organopolysiloxane in a coating thickness of about 1 μm followed by irradiation with two 2-kilowatts high-pressure mercury lamps placed 8 cm apart from the coated surface for a varied irradiation time of 0.06 to 5.0 seconds in an atmosphere of air or nitrogen. The thus photocured coating layers were examined for the surface tackiness and adhesion to the substrate as well as the releasability against three kinds of adhesive agents. The testing conditions for the releasability are given below and the results of these tests are set out in Table 1 below together with the irradiation time in each case.

Testing procedure for releasability by peeling:

The polyethylene-laminated paper having a coating layer of the photocured organopolysiloxane obtained in the above described manner was conditioned by keeping for 24 hours in an atmosphere of 65% relative humidity at 23° C. and then coated with either one of the following three commercially available adhesive agents Adhesives I to III in a coating thickness of about 130 μm as wet.

| Adhesive I: | Oribine PS-1003D, a solution type rubber based adhesive agent manufactured by Toyo Ink Co. |
|---|---|
| Adhesive II: | Oribine KS-8170, a solution type acrylic adhesive agent manufactured by the same company |
| Adhesive III: | Oribine BPW-2202, an aqueous emulsion type acrylic adhesive agent manufactured by the same company |

The thus coated paper was dried in an air oven at 100° C. for 3 minutes in the cases of the Adhesives I and II or for 5 minutes in the cases of the Adhesive III. After cooling to room temperature, a surface paper was placed on the adhesive-coated surface, pressed with a tape roller of 2 kg weight to be bonded and seasoned for 3 hours in an atmosphere of 65% relative humidity at 23° C. Then peeling test of the surface paper was carried out with a recording tensile tester in a 180° C. direction at a peeling velocity of 300 mm/minute to give the results of the peeling resistance between the cured organopolysiloxane surface and the adhesive agents as set out in Table 1 in grams per 5 cm width.

TABLE 1

| Organo-polysil-oxane | Irradia-tion time, seconds | Atmos-phere | Surface tacki-ness | Adhesion to sub-strate | Peeling resistance, g/5cm | | |
|---|---|---|---|---|---|---|---|
| | | | | | Adhesive I | Adhesive II | Adhesive III |
| S-I | 0.6 | air | no | good | 80 | 110 | 75 |
| S-II | 1.2 | air | no | good | 85 | 113 | 79 |
| S-III | 0.3 | air | no | good | 60 | 100 | 73 |
| S-IV | 0.8 | air | no | good | 69 | 95 | 70 |
| S-V | 0.06 | air | no | good | 300 | 245 | 310 |
| S-VI | 2.0 | air | no | good | 42 | 30 | 18 |
| S-VII | 5.0 | air | yes | poor | no peeling | no peeling | no peeling |
| S-VIII | 2.0 | air | yes | poor | no peeling | no peeling | no peeling |
| S-IX | 1.2 | nitrogen | no | good | 81 | 105 | 70 |

EXAMPLE 6

A mixture composed of 25.0 g (0.1 mole) of 3-thioacryloxypropyl trimethoxysilane, 19.6 g (0.1 mole) of 3-mercaptopropyl trimethoxysilane and 96.0 g (0.8 mole) of dimethyldimethoxysilane in 400 g of toluene was added drop-wise into 400 ml of a 10% hydrochloric acid kept at a temperature of 50° to 60° C. with agitation to effect cohydrolysis of the silanes and the resultant reaction mixture was washed with water to neutral and dehydrated followed by removal of part of toluene to give a 60% toluene solution of an organopolysiloxane composed of 10%, 10% and 80% by moles of three kinds of organosiloxane units $CH_2=CH-CO-S+CH_2)_3SiO_{1.5}$, $HS+CH_2)_3SiO_{1.5}$ and $Me_2SiO$, respectively.

The thus obtained solution of the organopolysiloxane was admixed with acetophenone in an amount of 1% by weight based on the organopolysiloxane solid to give a photocurable composition.

A stainless steel plate was coated with this photocurable composition in a coating thickness of about 0.8 μm as dried and irradiated for 0.2 second with two 2-kilowatts high-pressure mercury lamps placed 8 cm apart from the coated surface to have the coating layer converted to a cured film.

In parallel, releasability test by peeling was undertaken in a similar manner to Example 5 with a polyethylene-laminated paper coated with the above photocurable composition in a coating thickness of about 0.8 μm as dried and photocured by irradiating for 0.2 second under the same irradiation conditions as above. The results of the peeling resistance were 128, 40 and 15 g/5 cm for the Adhesives I, II and III, respectively.

Further, the polyethylene-laminated paper provided with the photocured organopolysiloxane coating layer was subjected to the tests of residual adhesion and rub-off in the conditions as specified below to find that the residual adhesion was 88% and absolutely no change of the appearance was observed in the rub-off test.

Procedure for the determination of residual adhesion:

The residual adhesion in % is a ratio of two values of peeling resistance obtained in the following two different ways. Firstly, the polyethylene-laminated paper provided with the photocured organopolysiloxane coating layer was, after seasoning for 24 hours in an atmosphere of 65% relative humidity at 23° C., bonded with a commercially available adhesive tape of 2.5 cm width (Lumirror 31B, a product by Nitto Denko Co.) on the surface of the cured organopolysiloxane and pressed at 70° C. under a load of 20 g/cm². After seasoning for 4 hours in the same atmosphere as above with the loading weight removed, the adhesive tape was peeled off and it was further bonded to the surface of a stainless steel plate by pressing with a roller of 2 kg weight moved once back and forth followed by keeping for 30 minutes in the same atmosphere as above. Then the adhesive tape was peeled from the surface of the stainless steel in a 180° C. direction at a peeling velocity of 300 mm/minute and the peeling resistance was recorded.

Secondly, the same adhesive tape was bonded to the surface of a plate of a fluorocarbon resin and kept for 20 hours at 70° C. under a load of 20 g/cm² followed by seasoning for 3 hours in an atmosphere of 65% relative humidity at 23° C. Then the adhesive tape was peeled off from the fluorocarbon resin plate and the bonding and peeling with a stainless steel plate were carried out with this peeled tape in the same manner as in the first peeling test and the residual adhesion was calculated as a ratio of the value of the first peeling resistance to the value of the second peeling resistance in %.

Procedure for the rub-off test:

The surface of the photocured organopolysiloxane layer was rubbed with a finger tip moved 10 times back and forth and the appearance of the surface after this rubbing was examined visually.

EXAMPLE 7

Three kinds of thioacyloxy-containing organopolysiloxanes were prepared. They were all expressed by the general formula (VI) given above, in which m was 6, n was 194 and A was a 3-thioacryloxypropyl, 3-thiocinnamoyloxypropyl or 3-thiomethacryloxypropyl group, respectively. Further, a mercaptopropyl-containing diorganopolysiloxane of the formula

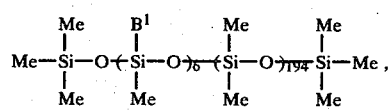

in which $B^1$ was a 3-mercaptopropyl group HS—$CH_2$)$_3$, was prepared.

Seven kinds of photocurable organopolysiloxane compositions were prepared each by blending 100 parts by weight of either one of the thioacyloxy-containing organopolysiloxanes alone, the mercaptopropyl-containing diorganopolysiloxane alone or a mixture of these two types of organopolysiloxanes in such a mixing ratio that the molar ratio of the thioacyloxy groups to the mercaptopropyl groups was 70:30 with 10 parts by weight of a photosensitizer which was a benzoin group-containing diorganopolysiloxane of the formula

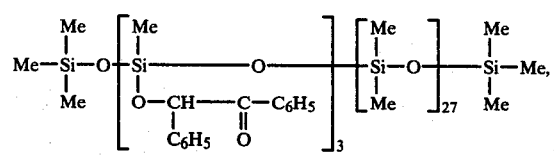

These photocurable organopolysiloxane compositions were examined by coating a polyethylene-laminated paper with the composition followed by irradiation with light in just the same manner as in Example 6 though with different irradiation times and subjecting the thus photocured coating films to the tests of peeling resistance and residual adhesion as well as to the rub-off test. The formulation of the compositions, the minimum irradiation time required for complete photocuring of the composition and the results of the tests are set out in Table 2 below.

In the table, the results of the rub-off test are expressed by the following criteria.

A: absolutely no change in the appearance of the cured film after rubbing

B: partial peeling or destruction of the cured film in the rubbed area

C: peeling of the cured film extended to the proximity of the rubbed area

EXAMPLE 8

Three kinds of photocurable organopolysiloxane compositions were prepared with a 3-thioacryloxypropyl-containing organopolysiloxane of the formula

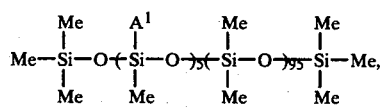

where $A^1$ is a 3-thioacryloxypropyl group, and/or a 3-mercaptopropyl-containing organopolysiloxane of the formula

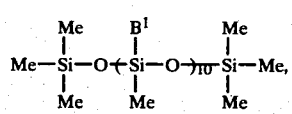

where $B^1$ is a 3-mercaptopropyl group, together with acetophenone as a photosensitizer. Each of the compositions was applied to the surfaces of various kinds of substrate plates in a coating thickness of about 10 μm and irradiated with ultraviolet light in the same manner as in the preceding example to be photocured.

TABLE 2

| Type of thioacyloxypropyl group | Thioacyloxy:mercaptomolar ratio | Irradiation time, seconds | Peeling resistance, g/5 cm | | | Residual adhesion, % | Rub-off test |
|---|---|---|---|---|---|---|---|
| | | | Adhesive I | Adhesive II | Adhesive III | | |
| 3-Thioacryloxypropyl | 70:30 | 0.1 | 128 | 39 | 13 | 90 | A |
| 3-Thiocinnamoyloxypropyl | 70:30 | 0.2 | 135 | 49 | 19 | 85 | A |
| 3-Thiomethacryloxypropyl | 70:30 | 0.2 | 90 | 47 | 21 | 81 | A |
| None | 0:100 | 0.6 | 85 | 33 | 15 | 62 | C |
| 3-Thioacryloxypropyl | 100:0 | 0.3 | 145 | 42 | 22 | 65 | B-A |
| 3-Thiocinnamoyloxypropyl | 100:0 | 0.6 | 138 | 50 | 24 | 69 | B |
| 3-Thiomethacryloxypropyl | 100:0 | 0.8 | 113 | 53 | 28 | 58 | B |

The adhesive strength of the thus cured coating films to the substrate surface was examined by rubbing with a finger tip in a similar manner to the rub-off test in the preceding examples. The results of this rubbing test are set out by the rating of A, B and C in Table 3 together with the formulation of the compositions and irradiation time with the ultraviolet light.

weight based on the total amount of the above two kinds of the organopolysiloxanes.

The photocuring of these photocurable organopolysiloxane compositions as well as the tests of the photocured coating films were undertaken in the same manner as in Example 7.

TABLE 3

| 3-Thioacryloxypropyl-containing organopolysiloxane, parts by weight | 3-Mercaptopropyl-containing organopolysiloxane, parts by weight | Acetophenone, parts by weight | Irradiation time, seconds | Results of rubbing test on the substrate of: | | | | | |
|---|---|---|---|---|---|---|---|---|---|
| | | | | Aluminum | Copper | Glass | Vinyl chloride resin, flexible | Polyethylene | Epoxy resin |
| 100 | 2 | 1 | 0.2 | A | B | A | A | A | A |
| 100 | 0 | 1 | 1.2 | A | C | A | C | A | A |
| 0 | 100 | 1 | 1.2 | B | C | B | C | C | A |

EXAMPLE 9

Four kinds of photocurable organopolysiloxane compositions were prepared by blending a 3-thioacryloxypropyl-containing organopolysiloxane of the formula

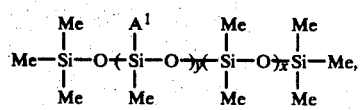

where $A^1$ was a 3-thioacryloxypropyl group and x and y were each a positive integer as indicated in Table 4 below, and a 3-mercaptopropyl-containing organopolysiloxane of the formula

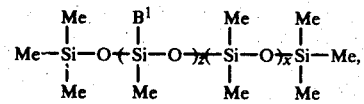

where $B^1$ was a 3-mercaptopropyl group and x and z were each a positive integer as indicated in Table 4 together with the benzoin-containing organopolysiloxane as used in Example 7 in an amount of 10% by weight based on the total amount of the above two kinds of the organopolysiloxanes.

The formulation of the compositions, irradiation time for photocuring with ultraviolet light and the results of the tests are set out in Table 4.

For comparison, another photocurable organopolysiloxane composition was prepared with 100 parts by weight of a 3-mercaptopropyl-containing organopolysiloxane of the above given formula where x=194 and z=6 and, instead of the 3-thioacryloxypropyl-containing organopolysiloxane, 2 parts by weight of a vinyl-containing organopolysiloxane of the formula

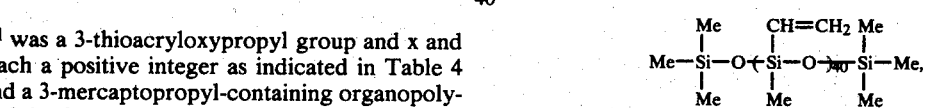

together with 10 parts by weight of benzophenone as a photosensitizer. Photocuring of this comparative composition and the tests of the photocured coating film were carried out in the same manner as above to give the results also shown in Table 4.

TABLE 4

| 3-Thioacryloxypropyl-containing organopolysiloxane | | | 3-Mercaptopropyl containing organopolysiloxane | | | Irradiation time, seconds | Peeling resistance, g/5 cm | | | Residual adhesion, % | Rub-off test |
|---|---|---|---|---|---|---|---|---|---|---|---|
| x | y | Parts by weight | x | z | Parts by weight | | Adhesive I | Adhesive II | Adhesive III | | |
| 194 | 6 | 50 | 194 | 6 | 50 | 0.1 | 140 | 42 | 20 | 83 | A |
| 194 | 6 | 30 | 194 | 6 | 70 | 0.2 | 140 | 40 | 20 | 70 | A |
| 185 | 15 | 70 | 185 | 15 | 30 | 0.1 | 135 | 41 | 15 | 92 | A |
| 197 | 3 | 70 | 197 | 3 | 30 | 0.2 | 145 | 71 | 24 | 80 | A |
| (comparative, see text) | | | 194 | 6 | — | 0.6 | 93 | 19 | 13 | 70 | B |

What is claimed is:

1. A photocurable organopolysiloxane composition which comprises (a) an organopolysiloxane containing, in a molecule, at least one thioacyloxy-containing organosiloxane unit represented by the general formula

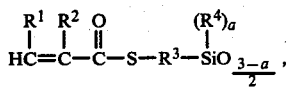

wherein $R^1$ is a hydrogen atom or a halogen-substituted or unsubstituted phenyl group, $R^2$ is a hydrogen atom or an alkyl group having from 1 to 4 carbon atoms, $R^3$ is a halogen-substituted or unsubstituted divalent hydrocarbon group, $R^4$ is a halogen-substituted or unsubstituted monovalent hydrocarbon group and a is zero, 1 or 2, and (b) an effective amount of a photosensitizer.

2. The photocurable organopolysiloxane composition as claimed in claim 1 wherein the organopolysiloxane further contains, in a molecule, at least one mercaptohydrocarbyl-containing organosiloxane unit represented by the general formula

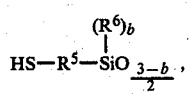

wherein $R^5$ is a divalent hydrocarbon group, $R^6$ is a monovalent hydrocarbon group and b is zero, 1 or 2.

3. The photocurable organopolysiloxane composition as claimed in claim 1 which further comprises a second organopolysiloxane containing, in a molecule, at least one mercaptohydrocarbyl-containing organosiloxane unit represented by the general formula

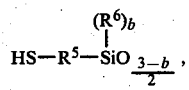

wherein $R^5$ is a divalent hydrocarbon group, $R^6$ is a monovalent hydrocarbon group and b is zero, 1 or 2.

4. The photocurable organopolysiloxane composition as claimed in claim 1 or claim 2 wherein $R^1$ and $R^2$ are each a hydrogen atom.

5. The photocurable organopolysiloxane composition as claimed in claim 1, claim 2 or claim 3 wherein $R^1$ is a hydrogen atom and $R^2$ is a methyl group.

6. The photocurable organopolysiloxane composition as claimed in claim 1, claim 2 or claim 3 wherein $R^1$ is a phenyl group and $R^2$ is a hydrogen atom.

7. The photocurable organopolysiloxane composition as claimed in claim 1, claim 2 or claim 3 wherein $R^3$ is a propylene group.

8. The photocurable organopolysiloxane composition as claimed in claim 2 or claim 3 wherein $R^5$ is a propylene group.

9. The photocurable organopolysiloxane composition as claimed in claim 1 wherein at least 95% in number of the organic groups bonded to the silicon atoms in the organopolysiloxane other than the thioacyloxy-containing groups expressed by the formula

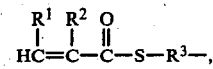

where $R^1$, $R^2$ and $R^3$ each have the same meaning as defined above, are methyl groups.

10. The photocurable organopolysiloxane composition as claimed in claim 2 or claim 3 wherein at least 95% in number of the organic group bonded to the silicon atoms in the organopolysiloxane or organopolysiloxanes other than the thioacyloxy-containing groups expressed by the formula

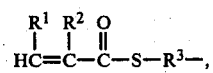

where $R^1$, $R^2$ and $R^3$ each have the same meaning as defined above, and the mercaptohydrocarbyl groups expressed by the formula $$HS-R^5-,$$

where $R^5$ has the same meaning as defined above, are methyl groups.

11. The photocurable organopolysiloxane composition as claimed in claim 3 wherein the ratio of the amounts of the organopolysiloxane containing, in a molecule, at least one thioacyloxy-containing organosiloxane unit and the organopolysiloxane containing, in a molecule, at least one mercaptohydrocarbyl-containing organosiloxane unit is in the range such that the molar ratio of the thioacyloxy groups to the mercaptohydrocarbyl groups is in the range from 1:100 to 100:1.

* * * * *